United States Patent
Sharma et al.

(10) Patent No.: US 11,889,675 B2
(45) Date of Patent: *Jan. 30, 2024

(54) DUAL PORT MEMORY CELL WITH IMPROVED ACCESS RESISTANCE

(71) Applicant: STMICROELECTRONICS INTERNATIONAL N.V., Schiphol (NL)

(72) Inventors: Tushar Sharma, East Delhi (IN); Tanmoy Roy, Grenoble (FR); Shishir Kumar, Greater Noida (IN)

(73) Assignee: STMICROELECTRONICS INTERNATIONAL N.V., Schiphol (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/052,514

(22) Filed: Nov. 3, 2022

(65) Prior Publication Data
US 2023/0091970 A1  Mar. 23, 2023

Related U.S. Application Data

(60) Continuation of application No. 17/491,201, filed on Sep. 30, 2021, now Pat. No. 11,532,633, which is a (Continued)

(51) Int. Cl.
*G11C 7/10* (2006.01)
*H10B 10/00* (2023.01)
(Continued)

(52) U.S. Cl.
CPC ............ *H10B 10/12* (2023.02); *G11C 5/063* (2013.01); *G11C 8/16* (2013.01); *G11C 11/412* (2013.01);
(Continued)

(58) Field of Classification Search
CPC ..... H10B 10/12; H01L 27/0207; G11C 5/063; G11C 8/16; G11C 11/412; G11C 11/417
(Continued)

(56) References Cited

U.S. PATENT DOCUMENTS 1,133,322 A * 3/1915 Seiberling .............. B29D 29/00
427/209
5,801,396 A  9/1998 Chan et al.
(Continued)

FOREIGN PATENT DOCUMENTS

CN  102024823 A  4/2011
CN  104183268 A  12/2014

OTHER PUBLICATIONS

Wang et al., "A 45nm Dual-Port SRAM with Write and Read Capability Enhancement at Low Voltage," IEEE, Sep. 26-29, 2007; pp. 211-214, *IEEE International SOC Conference*, 2007, doi: 10.1109/SOCC.2007.4545460.

*Primary Examiner* — Viet Q Nguyen
(74) *Attorney, Agent, or Firm* — Seed IP Law Group LLP

(57) ABSTRACT

The present disclosure is directed to a circuit layout of a dual port static random-access-memory (SRAM) cell. The memory cell includes active regions in a substrate, with polysilicon gate electrodes on the active regions to define transistors of the memory cell. The eight transistor (8T) memory cell layout includes a reduced aspect ratio and non-polysilicon bit line discharge path routing by positioning an active region for the first port opposite an active region for the second port and consolidating power line nodes at a central portion of the memory cell.

19 Claims, 8 Drawing Sheets

Related U.S. Application Data division of application No. 16/211,113, filed on Dec. 5, 2018, now Pat. No. 11,152,376.

(60) Provisional application No. 62/610,494, filed on Dec. 26, 2017.

(51) Int. Cl.
| | |
|---|---|
| *G11C 5/06* | (2006.01) |
| *G11C 11/412* | (2006.01) |
| *H01L 27/02* | (2006.01) |
| *G11C 8/16* | (2006.01) |
| *G11C 11/417* | (2006.01) |

(52) U.S. Cl.
CPC ........ *G11C 11/417* (2013.01); *H01L 27/0207* (2013.01)

(58) Field of Classification Search
USPC .......................................................... 365/63
See application file for complete search history.

(56) References Cited

U.S. PATENT DOCUMENTS

| | | | |
|---|---|---|---|
| 6,104,653 A | 8/2000 | Proebsting | |
| 6,781,869 B2 | 8/2004 | Ohbayashi et al. | |
| 6,885,609 B2 * | 4/2005 | Lee .......................... G11C 8/16 | |
| | | | 365/154 |
| 6,934,209 B2 | 8/2005 | Marr | |
| 7,272,814 B2 | 9/2007 | Faber et al. | |
| 7,592,247 B2 | 9/2009 | Yang et al. | |
| 7,738,282 B2 | 6/2010 | Liaw | |
| 8,004,918 B2 | 8/2011 | Gouin | |
| 8,009,463 B2 | 8/2011 | Liaw | |
| 8,183,639 B2 * | 5/2012 | Malinge .................... G11C 8/16 |
| | | | 257/E27.06 |
| 8,189,368 B2 | 5/2012 | Liaw | |
| 8,315,085 B1 | 11/2012 | Chang et al. | |
| 8,441,874 B2 * | 5/2013 | Sinha ...................... G11C 7/227 |
| | | | 365/194 |
| 8,638,592 B2 | 1/2014 | Badrudduza et al. | |
| 8,654,570 B2 | 2/2014 | Grover et al. | |
| 8,724,374 B1 | 5/2014 | Grover et al. | |
| 9,006,841 B2 * | 4/2015 | Kumar ................ H01L 27/0207 |
| | | | 257/E27.098 |
| 9,099,199 B2 | 8/2015 | Lin et al. | |
| 9,202,553 B2 | 12/2015 | Kobatake | |
| 9,305,633 B2 | 4/2016 | Grover et al. | |
| 9,418,728 B2 * | 8/2016 | Liaw ........................ G11C 8/14 |
| 10,177,132 B2 * | 1/2019 | Wang .................... G11C 11/412 |
| 11,152,376 B2 * | 10/2021 | Sharma ................ H01L 27/0207 |
| 11,532,633 B2 * | 12/2022 | Sharma ................ H01L 27/0207 |
| 2004/0120209 A1 | 6/2004 | Lee et al. | |
| 2006/0215441 A1 | 9/2006 | Matsushige et al. | |
| 2007/0030722 A1 | 2/2007 | Chanussot et al. | |
| 2007/0030741 A1 | 2/2007 | Nii et al. | |
| 2007/0081379 A1 | 4/2007 | Clinton et al. | |
| 2008/0130378 A1 | 6/2008 | Nautiyal | |
| 2009/0235171 A1 | 9/2009 | Adams et al. | |
| 2010/0188909 A1 | 7/2010 | Kenkare et al. | |
| 2011/0026289 A1 | 2/2011 | Liaw | |
| 2012/0170391 A1 | 7/2012 | Janardan et al. | |
| 2014/0133218 A1 * | 5/2014 | Liaw ...................... G11C 11/412 |
| | | | 438/283 |
| 2015/0009750 A1 * | 1/2015 | Schaefer ................ H10B 10/00 |
| | | | 365/156 |
| 2016/0181255 A1 * | 6/2016 | Nii .......................... G11C 8/16 |
| | | | 257/369 |

* cited by examiner

DUAL PORT MEMORY CELL WITH IMPROVED ACCESS RESISTANCE

BACKGROUND

Technical Field

The present disclosure is directed to a memory cell, and in particular, to an arrangement of layers in a dual port memory cell.

Description of the Related Art

Memory devices are common components in digital circuits. Memory devices can be formed from an array of single bit memory cells arranged as rows and columns. Each row is coupled to a word line, and each column is coupled to a bit line. One type of memory device with an array of memory cells is dynamic random-access-memory (DRAM). In DRAM, each memory cell includes a pass-gate transistor and a storage capacitor. The footprint of each DRAM memory cell is small, due to each memory cell having so few components, but because of current leakage through the pass-through circuit, each cell must be refreshed periodically to maintain the stored value. Another type of memory with an array of memory cells is static random access memory (SRAM). SRAM cells use a latching circuit for each memory cell to preserve the data value over time without the use of a refreshing circuit.

From a memory throughput standpoint, the accessibility of the memory cell is an important attribute. Accessibility refers to the speed at which the memory device can store or retrieve data. Accessibility is largely dependent upon the architecture of the system. Generally, the system throughput increases when more than one system device can directly access the memory device. The system throughput is generally further increased when more than one device can simultaneously access the memory.

SRAM provides increased access speeds over DRAM for a number of reasons. Access to the memory cell is quicker, since a refreshing circuit is not competing for access to the memory cells. Also, memory cell access speed can be further increased through the use of a dual port memory topology. A dual port memory has two access ports for each memory cell so that more than one system of the digital circuit may directly access the memory cell at the same time.

One disadvantage of known dual port SRAM cells is that the bit lines discharge through a portion of polysilicon. Polysilicon has a high relative resistance which lowers the memory cell current. Another disadvantage of known dual port SRAM cells is from having a thin word line. The word line RC time constant measures the responsiveness of the word line to a signal being applied, a higher RC time constant represents a higher lag in responsiveness to a signal. The word line is thin (e.g., 70 nm) for the distance it covers and the energy it carries compared to the similar thickness of the bit lines (e.g., 60 nm). Because the word line extends farther than the bit lines, the thin word line has a higher resistance (e.g., 14.20 ohms) than the similar bit line (1.95 ohms). The thin word line has a capacitance of 6.11E-16 f compared to the bit line with a capacitance of 1.82E-16 f. The resistance and capacitance build over distance, which leads to the high RC time constant of the word line and results in a slower response to a signal applied to the word line. The high aspect ratio of known dual port SRAM cells (e.g., 1.5 um×0.252 um for a ~6:1 aspect ratio) also causes the word line to be longer than is otherwise necessary and thus have an increased RC time constant and an increased access time.

BRIEF SUMMARY

The present disclosure is directed to a circuit layout of a dual port static random-access-memory (SRAM) cell. The memory cell includes active regions in a substrate, with polysilicon gate electrodes on the active regions to define transistors of the memory cell. The eight transistor (8T) memory cell layout includes a reduced aspect ratio and non-polysilicon bit line discharge path routing by positioning an active region for the first port opposite an active region of the second port and consolidating power line nodes at a central portion of the memory cell.

In one embodiment, a dual port bit memory cell has a semiconductor substrate with a first active area that itself includes a first bit line node, a first memory cell node, a first power line node, a second memory cell node, and a first inverted bit line node. The memory cell may also have a second active area in the substrate that includes a second bit line node, a third memory cell node, a second power line node, a fourth memory cell node, and a second inverted bit line node. These embodiments have gate electrodes in a semiconductor layer on the substrate that selectively couple the first bit line node and the first memory cell node, the first memory cell node and the first power line node, the first power line node and the second memory cell node, and the second memory cell node and the second bit line node. Additional gates may be provided to couple the same nodes for the second port of the memory cell in the second active area. Also, routing lines are provided in the semiconductor layer and in additional layers on the semiconductor layer to realize the memory cell architecture. The gates may be a polysilicon material, whereas any routing lines are a metal conductor. Thick word lines are provided in the layout such that the word lines have a width greater than a width of one of the active areas.

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in the specification and appended claims, the use of "correspond," "corresponds," and "corresponding" is intended to describe a ratio of or a similarity between referenced objects. The use of "correspond" or one of its forms should not be construed to mean the exact shape or size.

Throughout the specification, the term "layer" is used in its broadest sense to include a thin film, a cap, or the like, and one layer may be composed of multiple sub-layers.

Specific embodiments of memory cells are described herein; however, the present disclosure and the reference to certain arrangements, dimensions, and details and ordering of processing steps are exemplary and should not be limited to those shown.

Figure 1:
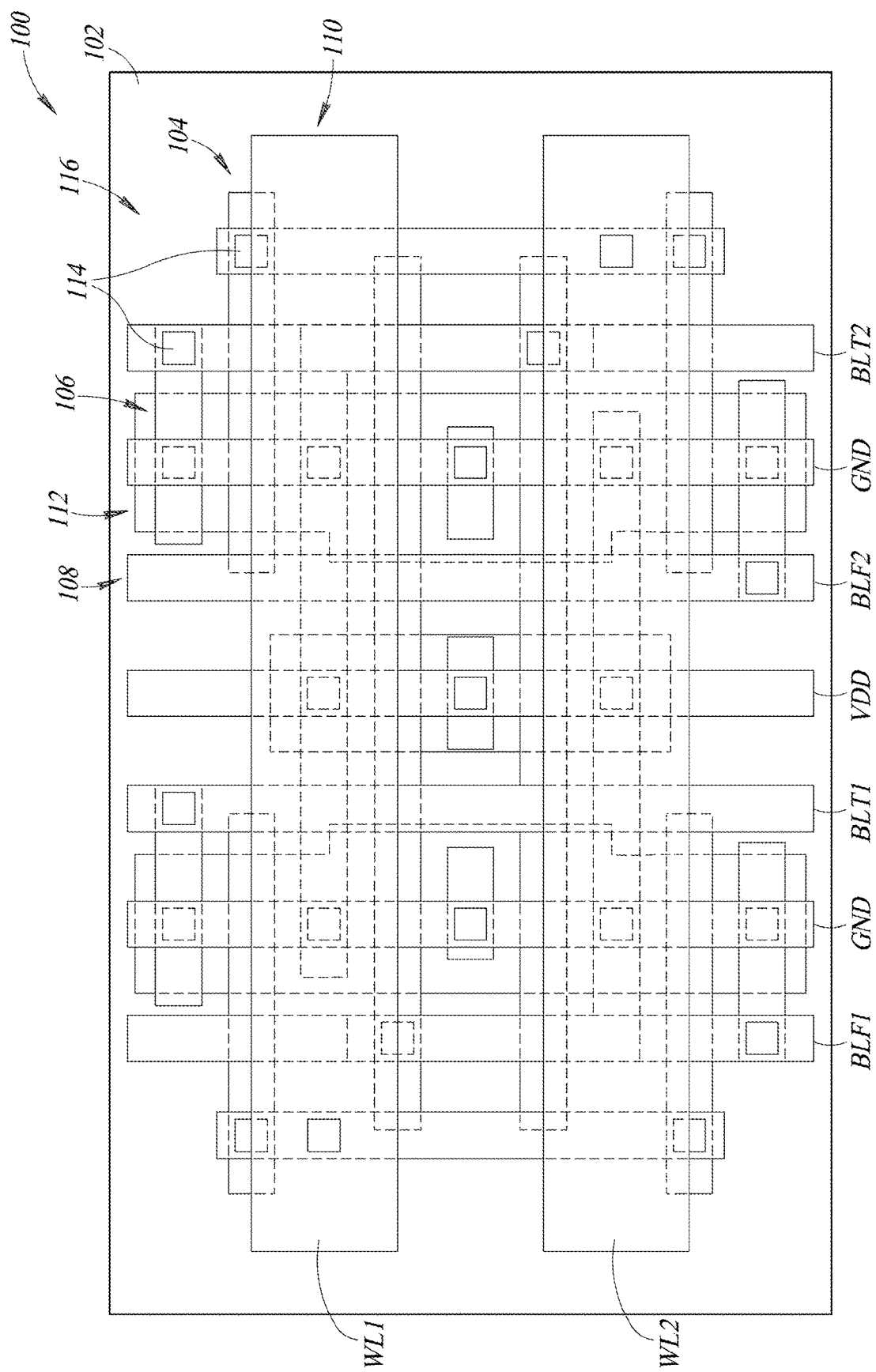
FIG. 1 is a top-down view of an exemplary memory cell.

FIG. 1 is a top-down view of an exemplary memory cell 100. The memory cell 100 is a two-read, two-write dual port static random-access-memory (SRAM) cell. The memory cell 100 has a stack of layers on a substrate 102. Each layer on the substrate includes a plurality of conductive and dielectric features. There is a first layer 104 on the substrate that includes a plurality of gates, a second layer 106 that includes a plurality of routing lines, a third layer 108 that includes a plurality of bit lines BLT1, BLT2, BLF1, BLF2, and power line nodes VDD and GND, and a fourth layer 110 that includes a plurality of word lines WL1 and WL2. Each of the components in the layers are depicted with a hashed outline where that component is obscured by a component in a layer above it. Conductive vias are shown as squares, and for visual aid, conductive vias that are coupled to a bottom of an unobscured layer are also not hashed, even though they may be obscured by that layer. The insulators in or between the various layers are omitted to improve visibility of the different layers.

In some embodiments, the substrate 102 is a silicon or other semiconductor substrate, the first layer 104 is a semiconductive polysilicon layer, and the second, third, and fourth layers 106, 108, 110 are conductive metal layers. The substrate includes active regions 112, which includes source, drain, and channel regions of the memory cell transistors. These active regions 112 are activated in operation by gate electrodes formed in the first layer 104. The second, third, and fourth layers 106, 108, 110 include signal routing lines. Conductive vias 114 are positioned throughout the memory cell 100 to couple the substrate 102 and the layers 104, 106, 108, 110 together. Also, the memory cell 100 can be classified as an eight transistor (8T) memory cell, which will be discussed in more detail below.

FIG. 1 depicts the memory cell 100 having a layout 116 when viewed from the top down. In some embodiments, the layout has an aspect ratio between 0.5:1 and 2:1 when viewed from the top down. In one embodiment, the layout 116 measures 0.866 um×0.504 um on the substrate 102 and has an aspect ratio of 1.72:1 when viewed from the top down. In other embodiments, other sizes and aspect ratios are possible. As compared to memory cells known in the art, the memory cell 100 has a shorter and thicker word line in the fourth layer 110 due to the decreased aspect ratio and the rearrangement of the layers. The shorter and thicker word line reduces resistance and capacitance, and in some embodiments results in a word line having a thickness of 150 nm, a capacitance of 5.86E-16 f (a −4% change), and a resistance of 2.85 ohms (a −80% change).

Additionally, the discharge of stored values of the memory cell 100 is through the routing lines in the second layer 106. The second layer is a low resistance electrical conductor, and thus does not suffer from the same high resistance of the previous memory cells which discharged through a polysilicon layer. By routing through the conductor of the second layer 106, the memory cell read current can be improved.

The features discussed above were shown to improve the RC time constant associated with doing a read operation on the memory cell 100. Specifically, simulation testing showed a decrease in response time from 762.6 pico-seconds to 441.6 pico seconds, a (40%) improvement, for a 256 memory cell array at 0.8V.

Figure 2:
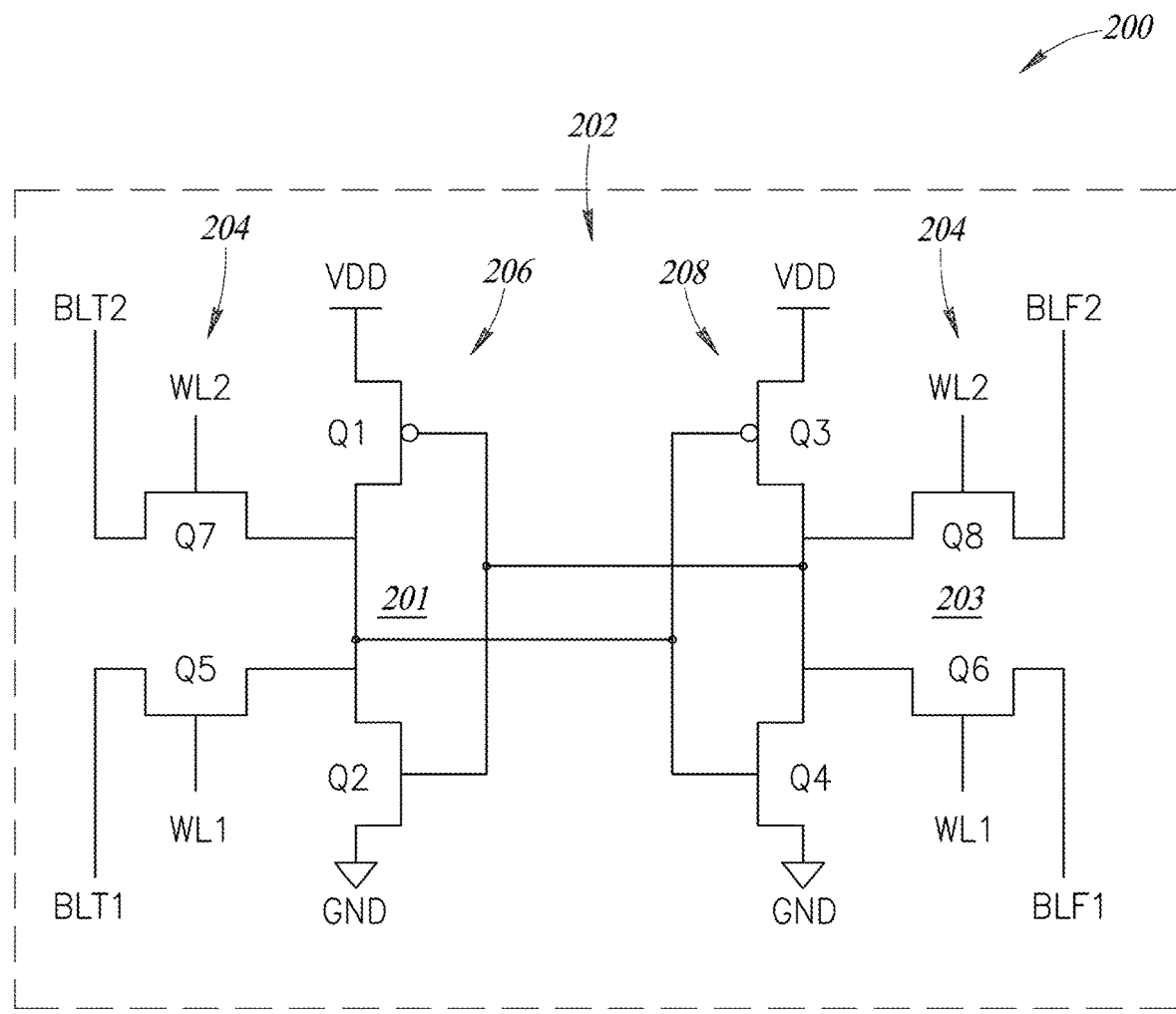
FIG. 2 is a schematic of the various components of the memory cell.

FIG. 2 is a schematic of the various components of the memory cell of FIG. 1. The memory cell 200 has as a two-read, two-write dual port SRAM cell. The memory cell 200 includes a memory component 202 and an access component 204. The memory component 202 stores values, and the access component 204 controls read-write access to the memory component 202.

The memory component 202 is a latch having a first inverter 206 and a second inverter 208 coupled together such that an output of the first inverter 206 is coupled to an input of the second inverter 208 and an output of the second inverter 208 is coupled to an input of the first inverter 206. The first inverter 206 and the second inverter 208 are each coupled to a first power line node VDD and a second power line node GND. The first inverter 206 has an output coupled to a first memory cell node 201 and an input coupled to a second memory cell node 203. The second inverter 208 has an output coupled to the second memory cell node 203 and an input coupled to the first memory cell node 201.

The first inverter 206 includes a first transistor Q1 and a second transistor Q2. The first transistor Q1 is coupled between the first power line node VDD and the first memory cell node 201. The second transistor Q2 is coupled between the first memory cell node 201 and the second power line node GND.

The second inverter 208 includes a third transistor Q3 and a fourth transistor Q4. The third transistor Q3 is coupled between the first power line node VDD and the second memory cell node 203. The fourth transistor Q4 is coupled between the second memory cell node 203 and the second power line node GND.

The access component 204 includes dual differential read/write ports, such as BLT1, BLF1, BLT2, BLF2. Specifically, the access component 204 includes a first bit line BLT1 and a second bit line BLT2 selectively coupled to the first memory cell node 201, and a first inverted bit line BLF1 and a second inverted bit line BLF2 selectively coupled to the second memory cell node 203. The first bit line BLT1 is coupled to the first memory cell node 201 by a fifth transistor Q5, with a gate of the fifth transistor Q5 coupled to a first word line WL1. The first inverted bit line BLF1 is coupled to the second memory cell node 203 by a sixth transistor Q6, with a gate of the sixth transistor Q6 coupled to the first word line WL1. The second bit line BLT2 is coupled to the first memory cell node 201 by a seventh transistor Q7, with a gate of the seventh transistor Q7 coupled to a second word line WL2. The second inverted bit line BLF2 is coupled to the second memory cell node 203 by an eighth transistor Q8, with a gate of the eighth transistor Q8 coupled to the second word line WL2.

To complete a read operation of the memory cell 200, which is read from the bit lines, i.e. from a first port BLT1, BLF1, the first step is to set the first bit line BLT1 and the first inverted bit line BLF1 to the first power line node VDD. Then the first bit line BLT1 and the first inverted bit line BLF1 are floated, i.e. disconnected from VDD and is not yet connected to any read/write circuitry. At that point, the fifth and sixth transistors Q5, Q6 turn on in response to the first word line WL1 going active (whether active is a digital high or low signal can vary depending on the specific transistors used). If the memory cell 200 has a high value stored in the first memory cell node 201 and a low value stored in the second memory cell node 203, then the fourth transistor Q4 will discharge the charge in the first inverted bit line BLF1. If the memory cell 200 has a high value stored in the second memory cell node 203 and a low value stored in the first memory cell node 201, then the second transistor Q2 will discharge the charge in the first bit line BLT1. Then a reading circuit will take a differential reading between the first bit line BLT1 and the first inverted bit line BLF1 to read the state of the memory.

To complete a read operation of the memory cell, which is read from the bit lines, i.e. from a second port, BLT2, BLF2, the first step is to set the second bit line BLT2 and the second inverted bit line BLF2 to the first power line node VDD. Then the second bit line BLT2 and the second inverted bit line BLF2 are floated. At that point the seventh and eighth transistors Q7, Q8 turn on in response to the second word line WL2 going active (whether active is a digital high or low signal can vary depending on the specific transistors used). If the memory cell 200 has a high value stored in the first memory cell node 201 and a low value stored in the second memory cell node 203, then the fourth transistor Q4 will discharge the charge in the second inverted bit line BLF2. If the memory cell 200 has a high value stored in the second memory cell node 203 and a low value stored in the first memory cell node 201, then the second transistor Q2 will discharge the charge in the second bit line BLT2. Then a reading circuit will take a differential reading between the second bit line BLT2 and the second inverted bit line BLF2.

Figure 3A:
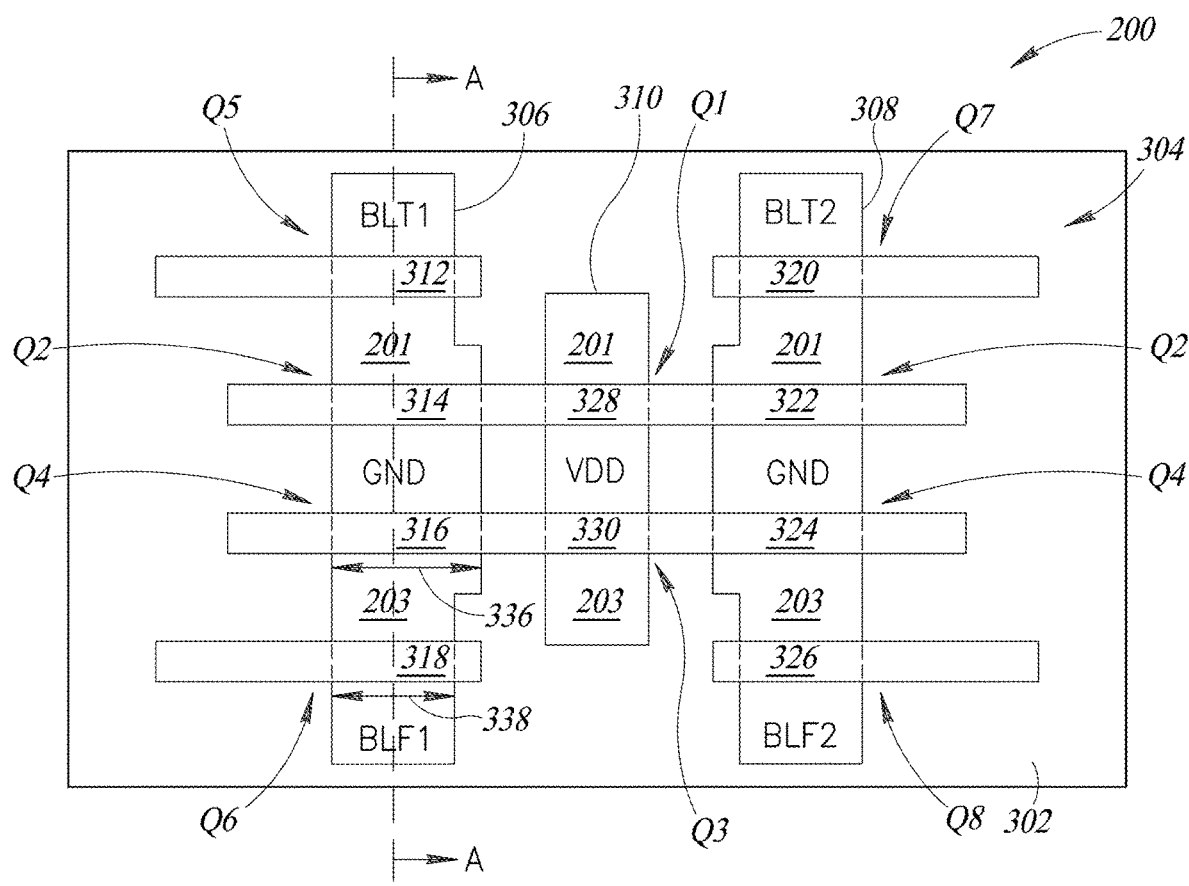
FIG. 3A is a top-down view of a substrate and a first layer of the memory cell.

FIG. 3A is a top-down view of a substrate 302 and portions of a first layer 304 of the memory cell 200. The substrate 302 is a silicon substrate, in one embodiment. In other embodiments, the substrate 302 is any semiconductor material or other suitable substrate. The substrate 302 includes a first active region 306, a second active region 308, and a third active region 310 in the substrate 302. The first, second, and third active regions include channels and source and drain regions of the transistors Q1-Q8 for the memory cell 200. The channels are between source and drain regions of each one of the respective transistors Q1-Q8. The source and drain regions may be defined by any method known in the art, and in one embodiment are doped active regions of the substrate 302.

The active regions 306, 308, 310 are physically separate from each other in some embodiments. The first active region 306 has a mirror image shape of the second active region 308, with a first portion having a first width 336 and a second portion having a second width 338. The first width being greater than the second width. The third active region 310 is positioned between the first and second active regions. The third active region 310 is smaller in length (measured perpendicular to width) than the first and second active regions and overlaps in part with the first portion of the first active region.

The first active region 306 includes a source/drain region that will be coupled to the first bit line BLT1. For clarity portions of the active regions are labeled with the signal reference numeral to which they will be coupled in later figures. The first memory cell node 201, the second power line node GND, the second memory cell node 203, and the first inverted bit line BLF1 will be coupled to various source/drain regions in the active regions 306. The second active region 308 includes source/drain regions that will be coupled to the second bit line BLT2, the first memory cell node 201, the second power line node GND, the second memory cell node 203, and the second inverted bit line BLF2. The third active region 310 is positioned between the first active region 306 and the second active region 308, and includes source/drain regions that will be coupled to the first memory cell node 201, the first power line node VDD, and the second memory cell node 203.

Also shown in FIG. 3A is part of the first layer 304 on the substrate 302. The first layer 304 includes gate electrodes of the transistors Q1-Q8. First, second, third, and fourth gate electrodes 312, 314, 316, 318 are on and extend transverse to the first active region 306. The first gate electrode 312 of the fifth transistor Q5 controls a channel in the first active region 306 between the first bit line BLT1 and the first memory cell node 201. The second gate electrode 314 of the second transistor Q2 controls a channel in the first active region 306 between the first memory cell node 201 and the second power line node GND. The third gate electrode 316 of the fourth transistor Q4 controls a channel in the first active region 306 between the second power line node GND and the second memory cell node 203. The fourth gate electrode 318 of the sixth transistor Q6 controls a channel in the first active region 306 between the second memory cell node 203 and the first inverted bit line BLF1.

Similarly, fifth, sixth, seventh, and eighth gate electrodes 320, 322, 324, 326 are on the second active region 308. The fifth gate electrode 320 of the seventh transistor Q7 controls a channel in the second active region 308 between the second bit line BLT2 and the first memory cell node 201. The sixth gate electrode 322 of the second transistor Q2 controls a channel in the second active region 308 between the first memory cell node 201 and the second power line node GND. In this way, the second transistor Q2 comprises two transistors in parallel, one in the first active region 306 and one in the second active region 308. The seventh gate electrode 324 of the fourth transistor Q4 controls a channel in the second active region 308 between the second power line node GND and the second memory cell node 203. In this way, the fourth transistor Q4 comprises two transistors in parallel, one in the first active region 306 and one in the second active region 308. The eighth gate electrode 326 of the sixth transistor Q8 controls a channel in the second active region 308 between the second memory cell node 203 and the first inverted bit line BLF1.

Ninth and tenth gate electrodes 328, 330 are on the third active region 310. The ninth gate electrode 328 of the first transistor Q1 controls a channel in the third active region 310 between the first memory cell node 201 and the first power line node VDD. Additionally, the ninth gate electrode 328 couples the second gate electrode 314 to the sixth gate electrode 322. The tenth gate electrode 330 of the third transistor Q3 controls a channel in the third active region 310 between the first power line node VDD and the second memory cell node 203. Additionally, the tenth gate electrode 330 couples the third gate electrode 316 to the seventh gate electrode 324.

In some embodiments, the first active region 306 has a polygon shape at the surface of the substrate 302. The polygon shape may resemble two rectangles of dissimilar size in contact on one side. In one embodiment in which gate width is measured in a first direction over active regions 306, 308, 310, a width of the first gate electrode 312 and a width of the fourth gate electrode 318 are equal and a width of the second gate electrode 314 and a width of the third gate electrode 316 are equal and greater than the width of the first gate electrode 312. The second active region 308 has a polygon shape at a surface of the substrate 302 in some embodiments. The polygon shape may resemble two rectangles of dissimilar size in contact on one side. The widths of the gate electrodes 320, 322, 324, 326 may mirror those of gate electrodes 312, 314, 316, 318. Additionally, the third active region 310 has a rectangular shape at the surface of the substrate 302 in some embodiments, with a width of the ninth gate electrode 328 being equal to a width of the tenth gate electrode 330 and less than the width of the first gate electrode 312. Other gate widths are possible within the scope of the present disclosure.

The first, second, and third active regions 306, 308, 310 may also have a length measured at the surface of the substrate 302 in a second direction orthogonal to the first direction. The length of first active region 306 can be greater than the width of the second gate electrode 314, and in some embodiments is at least three times as large as the width of the second gate electrode 314. The length of second active region 308 can be greater than the width of the sixth gate electrode 322, and in some embodiments is at least three times as large as the width of the sixth gate electrode 322. The length of third active region 310 can be less than the length of first active region 306.

Figure 3B:
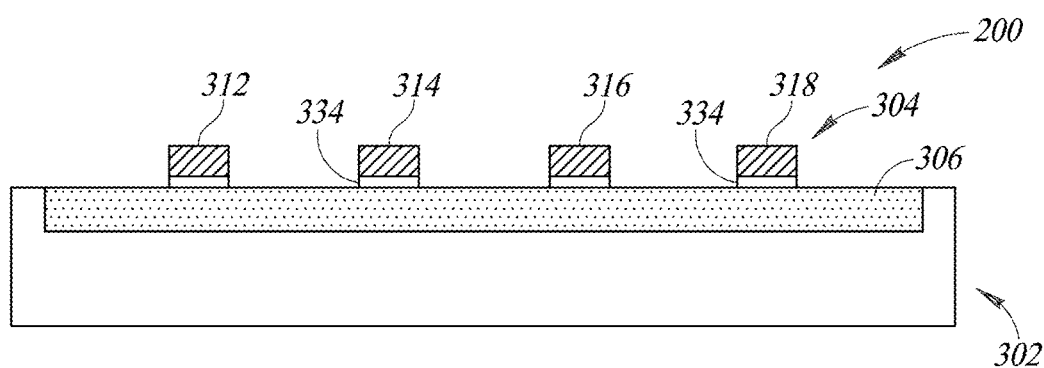
FIG. 3B is cross-sectional view of the substrate and layer of FIG. 3A.

FIG. 3B is cross-sectional view of the substrate and layer of FIG. 3A taken at the cross-section line AA. The substrate 302 is shown with the first active region 306 being in the substrate 302 and having a top surface coplanar with a top surface of the substrate 302. On the substrate 302 is the first layer 304. In the first layer 304 are the gate electrodes 312, 314, 316, 318, associated with the transistors Q5, Q2, Q4, Q6, respectively.

The gate electrodes are formed of polysilicon in one embodiment. In other embodiments, other gate materials may be used. Each of the gate electrodes are on thin insulators 334 to prevent the gate electrodes from being short circuited to the substrate 302 while allowing a charge on the gate electrodes to cause a conductive channel to form in the active regions adjacent to each gate electrode. The insulator 334 can be any type of insulator, such as an oxide. The insulator 334 is a gate dielectric.

Figure 4A:
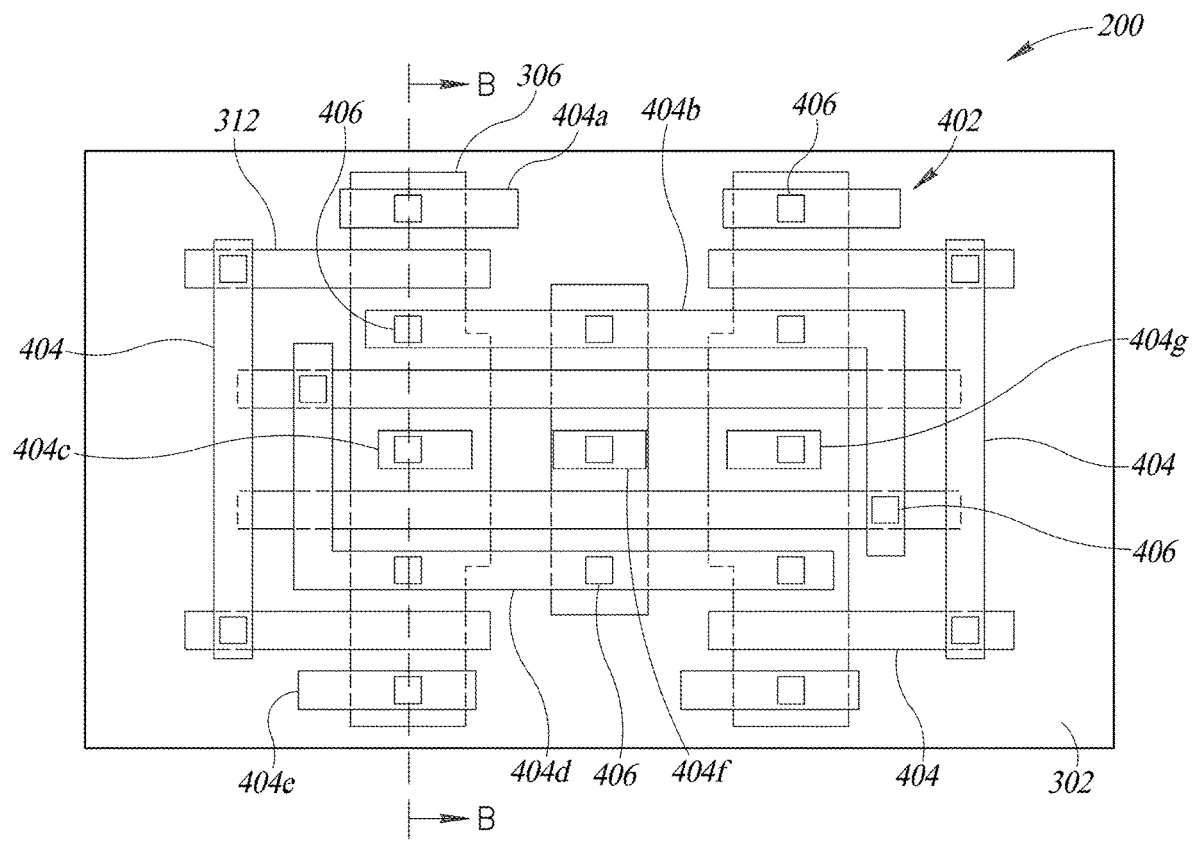
FIG. 4A is a top-down view of the substrate and first and second layers of the memory cell.
Figure 4B:
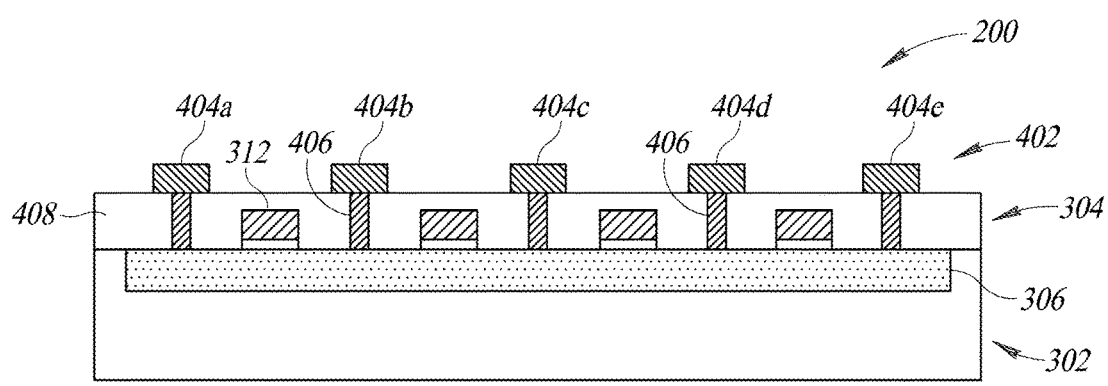
FIG. 4B is cross-sectional view of the substrate and layers of FIG. 4A.

FIGS. 4A and 4B are a top-down and cross-sectional views of the substrate 302, the first layer 304, and a second layer 402 of the memory cell 200. The first layer 304 includes first conductive vias 406 that coupled the active and gate to routing lines 404. The first conductive vias 406 may be any material, like a metal such as aluminum and may include a liner. The various electrical components in the first layer 304 are surrounded with a first insulator 408. The first insulator 408 can be an insulator or any other non-conductive material. In some embodiments, the first insulator 408 is the same material as the insulator 334.

The second layer 402 includes the first routing lines (or bridges) 404 that couple electrical components of the memory cell 200 together. The first routing lines 404 may be any conductive material, like a metal such as aluminum. A first routing line 404a is coupled to the first active region 306 and the first bit line BLT1. A first routing line 404b is coupled to the first active region 306 and the first memory cell node 201. A first routing line 404c is coupled to the first active region 306 and the second power line node GND. A first routing line 404d is coupled to the first active region 306 and the second memory cell node 203. A first routing line 404e is coupled to the first active region 306 and the first inverted bit line BLF1. The first routing line 404b can also be coupled to the second and third active regions 308, 310 and coupled to the seventh gate electrode 324. The first routing line 404d can also be coupled to the second and third active regions 308, 310 and coupled to the second gate electrode 314. A first routing line 404f is coupled to the third active region 310 and the first power line node VDD. A first routing line 404g is coupled to the second active region 308 and the second power line node GND. Other routing lines of the routing lines 404 can couple other terminals together, such as the first gate electrode 312 to the fourth gate electrode 318, and the fifth gate electrode 320 to the eighth gate electrode 326.

FIG. 4B is cross-sectional view of the substrate and layers of FIG. 4A taken at the cross-section line BB. FIG. 4B depicts the layers shown in FIG. 3B with the added layer of the second layer 402 formed on the first layer 304. The first routing lines 404 are shown coupled to the first conductive vias 406, which are coupled to the first active region 306. In other cross-sections of the memory cell 200, some or none of the first routing lines 404 are coupled to first conductive vias 406. Also, in other cross-sections of the memory cell 200, all or some of the first routing lines 404 are coupled to first conductive vias 406, which are coupled to gate electrodes. Some of the first routing lines 404 are coupled to multiple components through the bottom side and the top side of the second layer 402. In some embodiments other combinations are possible, such as a single coupling or no coupling through the top side or bottom side of the second layer 402. Additionally, in some embodiments none of the first routing lines 404 are in direct communication with a memory cell other than the memory cell 200. In other embodiments, one or more of the first routing lines 404 are in direct communication with a memory cell other than the memory cell 200.

Figure 5A:
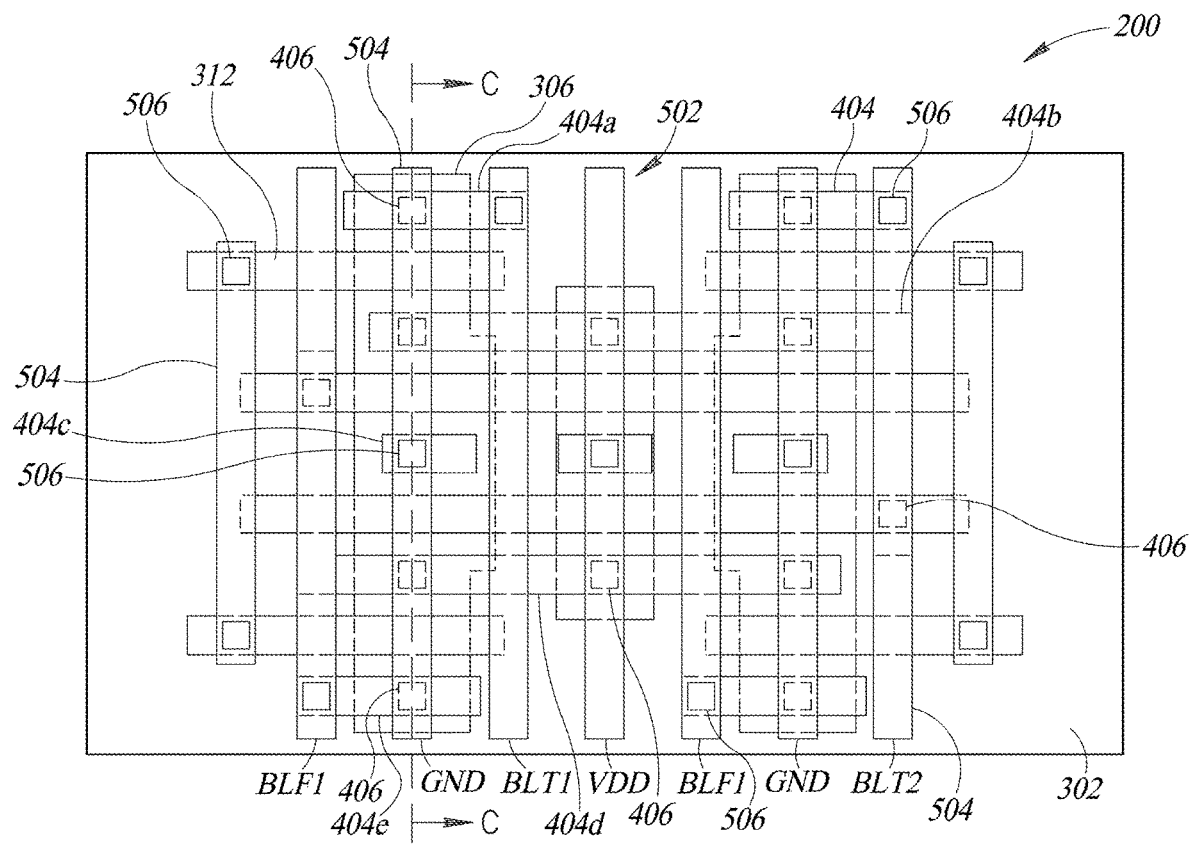
FIG. 5A is a top-down view of the substrate and first, second, and third layers of the memory cell.
Figure 5B:
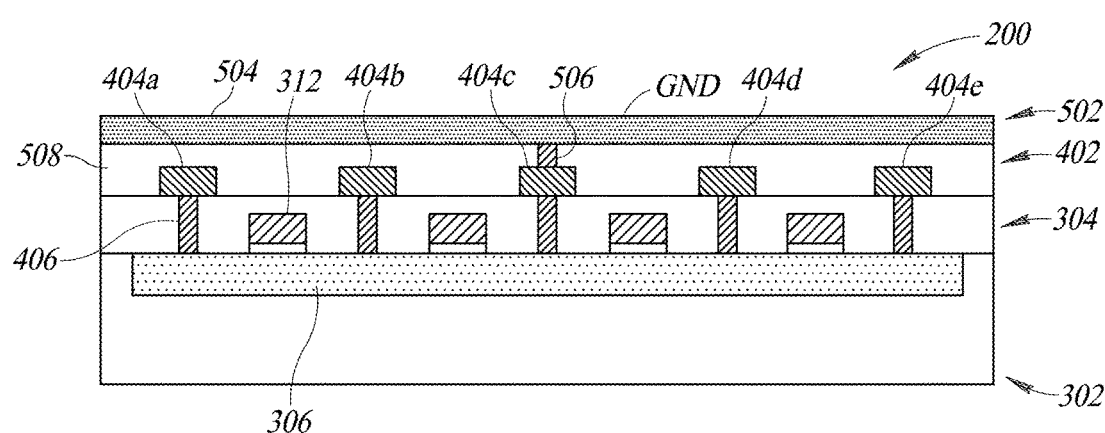
FIG. 5B is cross-sectional view of the substrate and layers of FIG. 5A.

FIGS. 5A and 5B are top-down and cross-sectional views of the substrate 302, the first layer 304, the second layer 402, and a third layer 502 of the memory cell 200. The second layer 402 includes second conductive vias 506. The second conductive vias 506 couple a top side of the second layer 402 with a bottom side of the third layer 502. The second conductive vias 506 may be any material, like a metal such as aluminum. The second layer 402 also includes a second insulator 508 around the electrical components of the second layer 402. The second insulator 508 can be an insulator or any other non-conductive material. In some embodiments, the second insulator 508 is the same material as the first insulator 408.

The third layer 502 includes second routing lines (or bridges) 504 that couple electrical components of the memory cell 200 together. The second routing lines 504 include, from left to right in the figure, a routing line that will couple to the first word line WL1, a routing line that is the first inverted bit line BLF1, a routing line that is the second power line node GND, a routing line that is the first bit line BLT1, a routing line that is the first power line node VDD, a routing line that is the second inverted bit line BLF2, a routing line that is the second power line node GND, a routing line that is the second bit line BLT2, and a routing line that will coupled to the second word line WL2. Some, all, or none of the second routing lines 504 may be directly coupled to memory cells other than the memory cell 200. For example, the bit lines BLT1, BLF1, BLT2, BLF2 may be coupled to adjacent memory cells. The first bit line BLT1 is coupled to the first routing line 404*a*. The second power line node GND is coupled to the first routing line 404*c*. The first inverted bit line BLF1 is coupled to the first routing line 404*e*. In other embodiments, other combinations of direct and indirect connections are possible. The various couplings of the routing lines are described in more detail below with respect to FIGS. 6A-6D.

FIG. 5B is cross-sectional view of the substrate and layers of FIG. 5A taken at the cross-section line CC. FIG. 5B depicts the layers shown in FIG. 4B with the added layer of the third layer 502 formed on the second layer 402. The second power line node GND of the second routing lines 504 is shown coupled to the second conductive vias 506 and the first routing line 404*c* of the second layer 402, and coupled to the first conductive vias 406 of the first layer 304 and to the first active region 306. In other cross-sections of the memory cell 200, some or none of the second routing lines 504 are coupled to second conductive vias 506. Also, in other cross-sections of the memory cell 200, all or some of the second routing lines 504 are coupled to gate electrodes. Some of the second routing lines 504 are coupled to multiple components through the bottom side and the top side of the third layer 502. In some embodiments other combinations are possible, such as a single coupling or no coupling through the top side or bottom side of the third layer 502. Additionally, in some embodiments some of the second routing lines 504 are in direct communication with a memory cell other than the memory cell 200. In other embodiments, all or none of the second routing lines 504 are in direct communication with a memory cell other than the memory cell 200.

FIGS. 6A-6D are top-down and cross-sectional views of the substrate 302, the first layer 304, second layer 402, the third layer 502, and a fourth layer 602 of the memory cell. The third layer 502 also includes third conductive vias 608. The third conductive vias 608 couple a top side of the third layer 502 with a bottom side of the fourth layer 602. The third conductive vias 608 may be any material, like a metal such as aluminum. The third layer 502 also includes a third insulator 610 around the electrical components of the third layer 502. The third insulator 610 can be an insulator, an encapsulant, a molding compound, or any other non-conductive material. In some embodiments, the third insulator 610 is the same material as the second insulator 508.

The fourth layer 602 includes third routing lines (or bridges) 604 that couple electrical components of the memory cell 200 together. The third routing lines 604 may be any conductive material, like a metal such as aluminum. The third routing lines 604 include, from top to bottom in the figure, the first word line WL1 and the second word line WL2. Some, all, or none of the third routing lines 604 may be directly coupled to memory cells other than the memory cell 200. For example, word lines WL1, WL2 may be both directly coupled to adjacent memory cells. The first word line WL1 is coupled to a second routing line 504 coupled to the first gate electrode 312 and the fourth gate electrode 318. The second word line WL2 is coupled to a second routing line 504 coupled to the fifth gate electrode 320 and the eighth gate electrode 326. In other embodiments, other combinations of direct and indirect connections are possible.

The fourth layer 602 also includes a fourth insulator 606 around the electrical components of the fourth layer 602. The fourth insulator 606 can be an insulator, an encapsulant, a molding compound, or any other non-conductive material. In some embodiments, the fourth insulator 606 is the same material as the third insulator 610.

The third routing lines 604 are depicted as thicker than the second routing lines 504 and thicker than the first routing lines 404. In some embodiments, the third routing lines 604 are at least three times thicker than the second routing lines 504, or at least three times thicker than the first routing lines 404. The width of the word lines WL1, WL2 compared to the width of the bit lines BLT1, BLF1, BLT2, BLF2 enables the word lines to have a decreased RC time constant and a faster response time for a read operation. Additionally, for a read operation, at least one bit line BLT1, BLF1, BLT2, BLF2 will discharge the charge stored on that line. The discharge path of that energy can include the routing lines, conductive vias, and active regions, without including the gate electrodes. This signal routing allows the gate electrodes to be a polysilicon material, without decreasing the discharge current time of the memory cell.

Figure 6A:
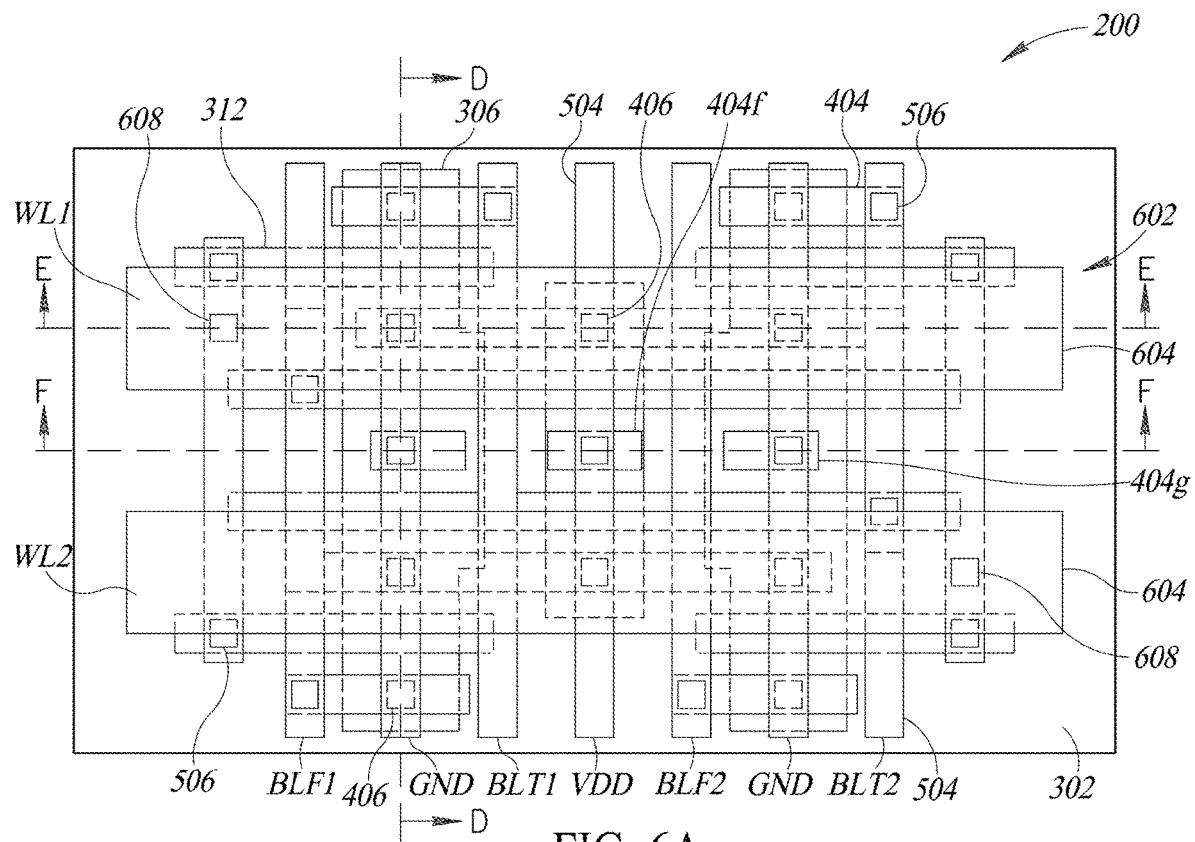
FIG. 6A is a top-down view of the substrate and first, second, third and fourth layers of the memory cell.
Figure 6B:
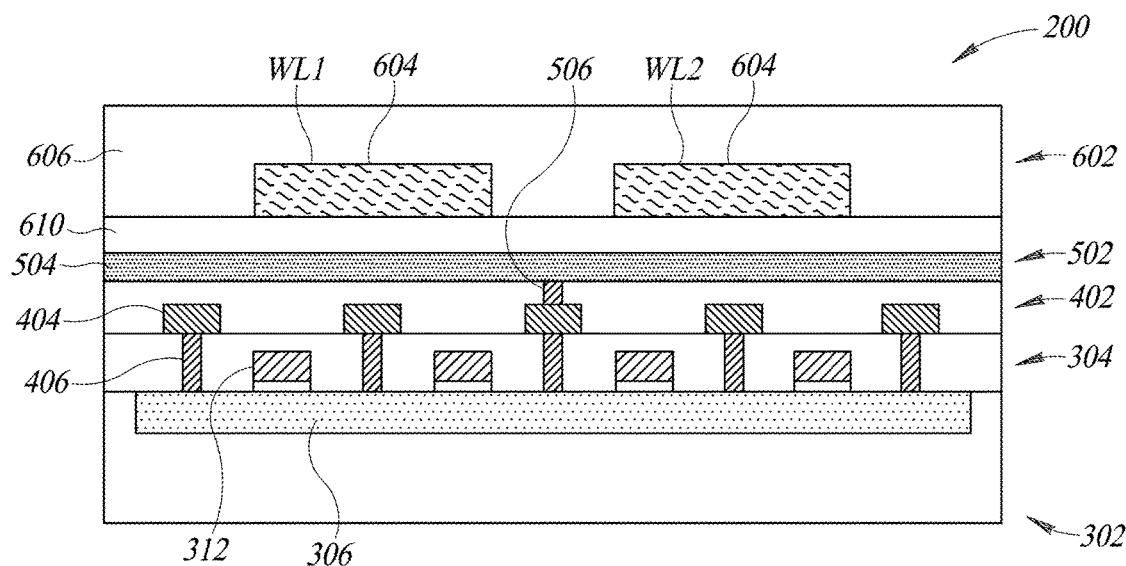
FIGS. 6B-6D are cross-sectional views of the substrate and layers of FIG. 6A.

FIG. 6B is cross-sectional view of the substrate and layers of FIG. 6A taken at the cross-section line DD. FIG. 6B depicts the layers shown in FIG. 5B with the added layer of the fourth layer 602 formed on the third layer 502. The first word line WL1 and the second word line WL2 of the third routing lines 604 are shown not coupled to any of the layers 304, 402, 502 or the substrate 302. In other cross-sections of the memory cell 200, some or all of the third routing lines 604 are coupled to one of the layers 304, 402, 502 or the substrate 302. Some of the third routing lines 604 can be coupled to at least one component through the bottom side or the top side of the fourth layer 602. In some embodiments other combinations are possible, such as a multiple couplings or no coupling through the top side or bottom side of the fourth layer 602. Additionally, in some embodiments some of the third routing lines 604 are in direct communication with a memory cell other than the memory cell 200. In other embodiments, all or none of the third routing lines 604 are in direct communication with a memory cell other than the memory cell 200.

Figure 6C:
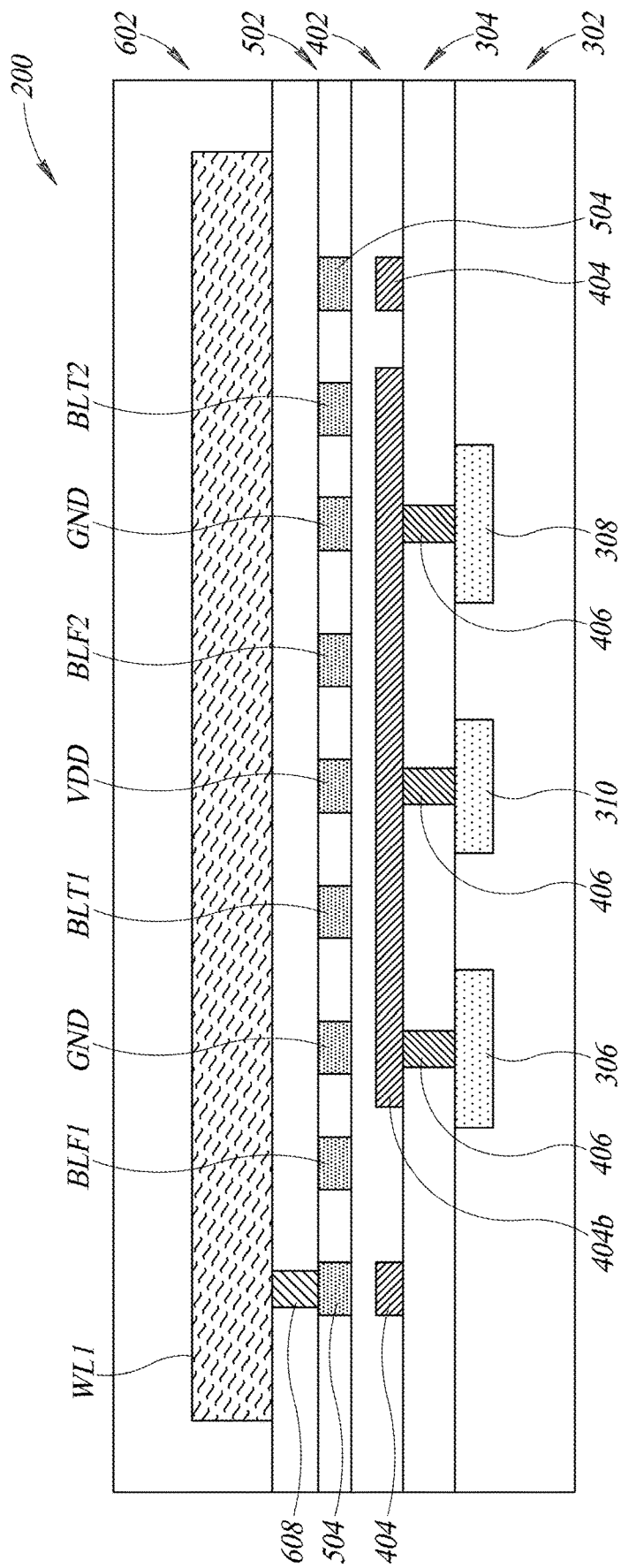

FIG. 6C is cross-sectional view of the substrate and layers of FIG. 6A taken at the cross-section line EE. The first word line WL1 of the third routing lines 604 is shown coupled to a second routing line 504 through the third conductive via 608. Also in the third layer 502 are the second routing lines 504 coupled to bitlines BLT1, BLF1, BLT2, BLF2, and power line nodes VDD, GND. In other cross-sections of the memory cell 200, these second routing lines 504 are coupled to one of the layers 304, 402, the substrate 302, or the third layer 602. In some embodiments other combinations are possible. FIG. 6C also depicts how the first routing line 404*b* couples the active regions 306, 308, 310 together to form the first memory cell node 201.

Figure 6D:
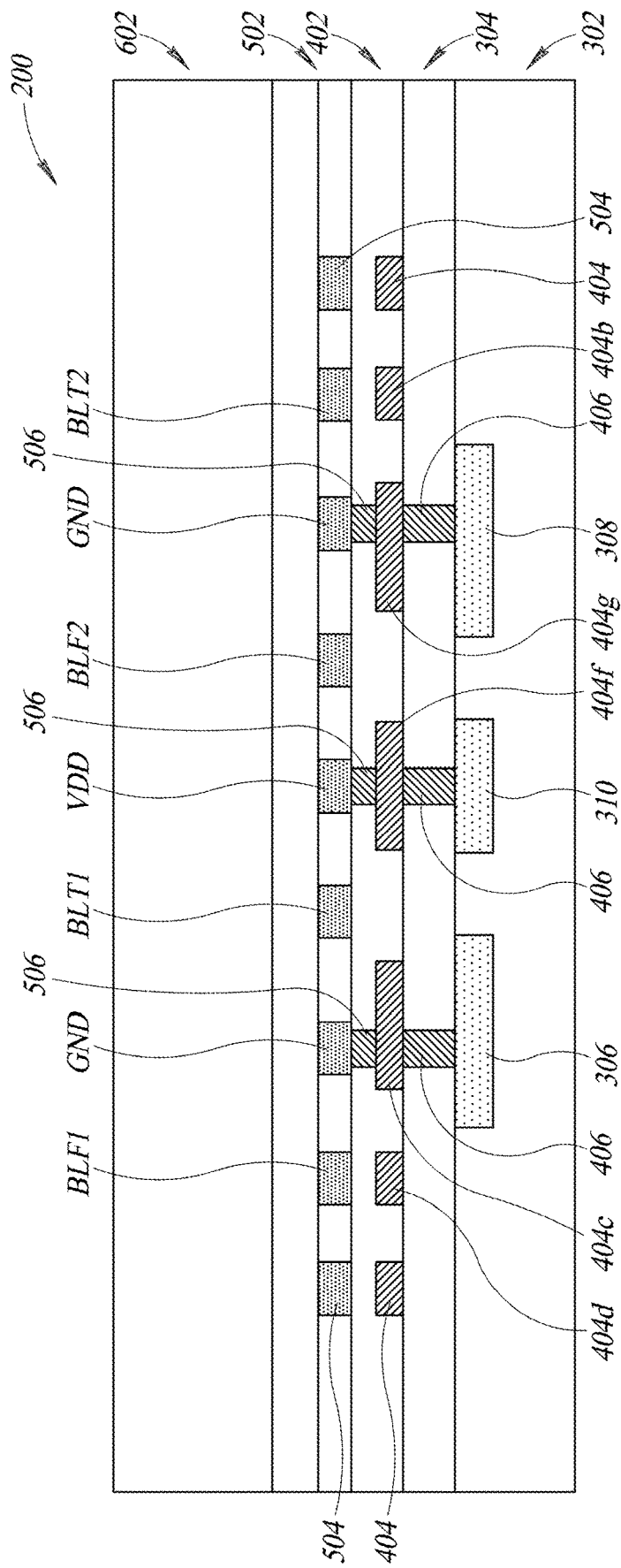

FIG. 6D is cross-sectional view of the substrate and layers of FIG. 6A taken at the cross-section line FF. Each of the second routing lines 504 are shown in similar positions with respect to one another and the other layers as in FIG. 6C. In addition, the power line nodes VDD, GND are shown coupled to the first routing lines 404 through second conductive vias 506. Specifically, the left-most second power line node GND is coupled to the first routing line 404*c*, the first power line node VDD is coupled to the first routing line 404*f*, and the right-most second power line node GND is coupled to the first routing line 404*g*. Each of these first routing lines 404*c*, 404*f*, 404*g* are coupled to a respective one of the active regions 306, 310, 308, respectively, through first conductive vias 406. In other cross-sections of the memory cell 200, the routing lines 404, 504, 604 can be coupled to one another or the substrate 302 in any one of a number of combinations.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    forming a dual port bit memory cell, by:
        forming a first active region in a semiconductor layer, the forming the first active region including:
            forming a first gate that selectively couples a first bit line node to a first memory cell node;
            forming a second gate that selectively couples the first memory cell node to a first power line node;
            forming a third gate that selectively couples the first power line node to a second memory cell node; and
            forming a fourth gate that selectively couples the second memory cell node to the first inverted bit line node.

2. The method of claim 1 wherein forming the active region includes forming the first active region to have a first width in a first direction and a first length in a second direction orthogonal to the first direction, the first length more than three times the first width.

3. The method of claim 2 wherein the forming the first active region including: forming a first bit line node;
    forming a first memory cell node;
    forming a first power line node in the first active region, the first power line node having a width equal to the first width;
    forming a second memory cell node; and
    forming a first inverted bit line node.

4. The method of claim 3, further comprising:
    forming a second active region in the semiconductor layer, the second active region including:
        forming a second bit line node;
        forming a third memory cell node electrically coupled to the first memory cell node;
        forming a second power line node;
        forming a fourth memory cell node electrically coupled to the second memory cell node; and
        forming a second inverted bit line node.

5. The method of claim 4, further comprising:
    forming a third active region in the semiconductor layer and between the first and second active regions, the third active region including:
        forming a fifth memory cell node electrically coupled to the third memory cell node;
        forming a third power line node; and
        forming a sixth memory cell node electrically coupled to the fourth memory cell node.

6. A method, comprising:
    reading a memory cell by:
        setting a first bit line and a first inverted bit line to a first power node, the first bit line coupled to a first memory cell node, the first inverted bit line coupled to a second memory cell node, the first memory cell node and the second memory cell node being coupled together;
        disconnecting the first bit line and the first inverted bit line from the first power node;
        activating a first transistor coupled to the first bit line and activating a second transistor coupled to the first inverted bit line by activating a first word line coupled to gate of the first and second transistors;
        in response to the first memory cell node having a high value and the second memory cell node having a low value, discharging a third transistor to the first inverted bit line;
        in response to the first memory cell node having a low value and the second memory cell node having a high value, discharging a fourth transistor to the first bit line.

7. The method of claim 6 wherein the third transistor coupled to the second transistor and the fourth transistor coupled to the first transistor.

8. The method of claim 7 wherein the third and fourth transistors are coupled to each other.

9. The method of claim 8 wherein a gate of the third transistor is coupled to a source/drain of the fourth transistor.

10. The method of claim 9, comprising reading a state of the memory cell by differentially reading between the first bit line and the first inverted bit line.

11. The method of claim 10, comprising:
    setting a second bit line and a second inverted bit line to the first power node;
    disconnecting the second bit line and the second inverted bit line from the first power node;
    activating a fifth transistor coupled to the second bit line and activating a sixth transistor coupled to the second inverted bit line by activating a second word line coupled to gate of the fifth and sixth transistors.

12. The method of claim 11, comprising:
    in response to the first memory cell node having a high value and the second memory cell node having a low value, discharging the third transistor to the second inverted bit line;
    in response to the first memory cell node having a low value and the second memory cell node having a high value, discharging the fourth transistor to the second bit line.

13. A method, comprising:
    forming in a substrate, a first active area and a second active area spaced away from one another, forming the first active area including:

forming a first bit line node;
forming a first memory cell node;
forming a first power line node;
forming a second memory cell node; and
forming a first inverted bit line node;
forming the second active area including:
forming a third memory cell node; and
forming a fourth memory cell node; and
forming a first metallization level over the substrate, including:
forming a first routing line coupling the first memory cell node to the third memory cell node; and
forming a second routing line coupling the second memory cell node to the fourth memory cell node.

14. The method of claim 13 wherein forming the second active area includes forming a second bit line node, forming a second power line node, and forming a second inverted bit line node.

15. The method of claim 14 comprising forming a gate level between the semiconductor substrate and the first metallization level, the forming of the gate level including:
forming a first gate configured to selectively couple the first bit line node and the first memory cell node;
forming a second gate configured to selectively couple the first memory cell node and the first power line node; and
forming a third gate configured to selectively couple the first power line node and the second memory cell node.

16. The method of claim 15 comprising forming a fourth gate configured to selectively couple the second memory cell node and the first inverted bit line node and forming a fifth gate configured to selectively couple the second bit line node and the third memory cell node.

17. The method of claim 16 comprising forming a sixth gate configured to selectively couple the third memory cell node and the second power line node, the sixth gate electrically coupled to the second gate, forming a seventh gate configured to selectively couple the second power line node and the fourth memory cell node, the seventh gate electrically coupled to the third gate, and forming an eighth gate configured to selectively couple the fourth memory cell node and the second inverted bit line node.

18. The method of claim 17, wherein forming the first metallization level includes:
forming a third routing line that electrically couples the first gate to the fourth gate; and
forming a fourth routing line that electrically couples the fifth gate to the eighth gate.

19. The method of claim 17, comprising forming in the semiconductor substrate a third active area between the first active area and the second active area and spaced away from both the first active area and the second active area, the forming of the third active area including:
forming a fifth memory cell node;
forming a third power line node; and
forming a sixth memory cell node.

* * * * *